United States Patent [19]

Itagaki et al.

[11] Patent Number: 4,943,452

[45] Date of Patent: Jul. 24, 1990

[54] METHOD FOR IMPROVING COMPOSITE MATERIALS BY USE OF A SILANE COUPLING AGENT

[75] Inventors: Akinari Itagaki; Masaaki Yamaya, both of Gunma; Hiroshi Yoshioka, Tokyo; Akihiko Watanabe; Keita Miyazato, both of Fukushima, all of Japan

[73] Assignees: Shin-Etsu Chemical Co., Ltd., Tokyo; Nitto Roseki Co., Ltd., Fukushima, both of Japan

[21] Appl. No.: 232,038

[22] Filed: Aug. 15, 1988

[30] Foreign Application Priority Data

Aug. 18, 1987 [JP] Japan ................... 62-204925

[51] Int. Cl.$^5$ .................. B05D 3/00; B05D 1/36; B05D 7/00
[52] U.S. Cl. .................. 427/299; 427/387; 427/407.2; 427/407.3; 428/428
[58] Field of Search .......... 427/299, 407.2, 407.3, 427/387; 252/392, 401; 106/287.23; 428/428

[56] References Cited

PUBLICATIONS

Union Carbide Catalog (1970 edition) "Chemicals and Plastics Physical Properties".
Paul et al. "Silicon–nitrogen compounds. IV. Synthesis of some N–alkoxysilyl–N'–phenylhydrazines" Indian J. Chem. 13(1) 76–77 (1975).
Goelitz et al "2,5–Diaza–3–silacyclopentanones" Ger. Offen. DE 1954447, May 6, 1971 P10.

Primary Examiner—Norman Morgenstern
Assistant Examiner—Roy V. King
Attorney, Agent, or Firm—Millen, White & Zelano

[57] ABSTRACT

A novel silane coupling agent is proposed for the pretreatment of a glass fiber-based or mica flake-based inorganic reinforcing material prior to compounding with an epoxy resin or a polyimide resin as the matrix to give a composite material such as laminates having excellent heat resistance against molten solder alloy and resistance against heat shock. The principal ingredient of the treatment solution is a trialkoxysilylalkyl-substituted polymethylene diamine compound of the general formula $(R^1O)_3SiR^2NH(CH_2)_nNHCH_2C_6H_5$, in which $R^1$ is a methyl or ethyl group, $R^2$ is a diavalent hydrocarbon group having 1 to 6 carbon atoms, e.g., methylene and propylene, and n is a integer of 4 to 8, or a hydrochloride thereof. This diamine compound is soluble in water, in particular, acidified with acetic acid and the aqueous solution is advantageouly stable in storage as compared with conventional silane coupling agents.

11 Claims, No Drawings

METHOD FOR IMPROVING COMPOSITE MATERIALS BY USE OF A SILANE COUPLING AGENT

BACKGROUND OF THE INVENTION

The present invention relates to a method for improving various properties of composite materials and a treatment agent therefor. More particularly, the present invention relates to a method for improving heat resistance against molten solder alloy and resistance against heat shock of a composite material composed of an inorganic reinforcing material such as glass fibers and mica flakes and a matrix resin such as epoxy resins and polyimide resins and a treatment agent of which the principal ingredient is a silane coupling agent.

Among various types of composite materials composed of an inorganic reinforcing material and a synthetic resin as the matrix, the most widely used ones in a variety of applications are those composed of glass fibers, e.g., glass cloths, glass tapes, glass mats and glass papers, or mica flakes as the inorganic reinforcing material and an epoxy resin, phenolic resin, polyimide resin, polyamide resin and the like as the matrix. It is a well established technology that the inorganic reinforcing material is subjected prior to compounding with the matrix resin to a pretreatment with a so-called silane coupling agent such as 3-aminopropyl triethoxy silane with the amino group as the functional group and 3-glycidyloxpropyl trimethoxy silane with the epoxy group as the functional group. The pretreatment of the inorganic reinforcing material with a silane coupling agent is undertaken in order to enhance the adhesion between the inorganic reinforcing material and the matrix resin with an object to improve the composite material prepared therefrom such as laminated plates with respect to the mechanical strength, electric properties, resistance against water either cold or boiling, resistance against chemicals and other important properties.

As is well known, the rapid progress and growth in the electric technology and industry in recent years have produced an increasing demand for laminated plates used as a substrate of printed circuit boards as prepared by using an epoxy resin or a polyimide resin as the matrix. Laminated plates for printed circuit board must be highly heat-resistant because the manufacturing process of printed circuit boards involves a step in which the substrate is immersed in a bath of molten solder alloy for the purpose of wiring. Conventional laminated composite materials prepared by using the above mentioned known silane coupling agents are disadvantageously poor in the heat resistance against molten solder slloy, presumably due to the large stress caused by curing at the interface between the inorganic reinforcing material and the matrix resin. An improved method in this regard has been proposed in Japanese Patent Publication 57-41771 in which the pretreatment of the inorganic reinforcing material is undertaken by using a cationic silane compound having a vinyl benzyl amino group or an aniline-substituted silane compound as the silane coupling agent. This method, however, is not completely effective in preventing blistering on the laminate, prepared using the silane coupling agent, when the laminate is immersed in a bath of molten solder alloy. In addition, the above mentioned cationic silane compound having a vinyl benzyl amino group is inherently poorly soluble in water so that preparation of a treatment solution requires a complicated process involving solubilization of the silane compound in water by a preliminary hydrolysis treatment to introduce hydrophilic silanol groups. The treatment solution of the solubilized silane compound is unstable and sometimes causes staining problems on the surface of the inorganic reinforcing material treated therewith, resulting in what appears to be of oil spots. The aniline-substituted silane compound is also defective due to low stability against exposure to light, which produces coloration so that the silane compound per se or the inorganic reinforcing material treated therewith must be kept in dark.

Further, laminated plates for printed circuit board are required to be improved in the resistance against heat shock because otherwise the heat shock caused by the immersion of the laminate in a bath of molten solder alloy may destroy the bonding between the matrix resin and the inorganic reinforcing material such as glass cloths or bonding between the surface of the laminate and the copper foil adhesively bonded thereto for forming an electric circuit, due to the stress caused by the difference in the thermal expansion coefficients.

Thus, eagerly desired is an improved treatment agent for the pretreatment of an inorganic reinforcing material used in composite materials of which the above mentioned problems relative to the heat resistance against molten solder alloy and resistance against heat shock of the composite material have been simultaneously and fully solved.

SUMMARY OF THE INVENTION

The present invention accordingly has an object to provide a novel and improved treatment agent for an inorganic reinforcing material used in a composite material based on an epoxy resin, polyimide resin and the like to solve the above mentioned problems in the prior art.

In a composition aspect, this invention relates to treatment agent of the invention for a pretreatment of an inorganic reinforcing material used in a composite material which comprises:

(A) a solvent which is preferable water; and
(B) a trialkoxysilyl-substituted polymethylene diamine compound represented by the general formula $$(R^1O)_3SiR^2NH(CH_2)_nNHCH_2C_6H_5, \qquad (I)$$

in which $R^1$ is a methyl or ethyl group, $R^2$ is a divalent hydrocarbon group having 1 to 6 carbon atoms and n is an integer in the range from 4 to 8, or a hydrochlride salt thereof dissolved in the solvent.

The present invention also has an object to provide a method for the preparation of a composite material composed of an inorganic reinforcing material such as glass fibers and mica flakes and a matrix resin such as epoxy resins and polyimide resins.

The method of this invention comprises the steps, prior to compounding of the inorganic reinforcing material and the matrix resin, of treating the inorganic reinforcing material with a treatment agent defined above to deposit the trialkoxysiyl-substituted polymethylene diamine compound on the surface of the inorganic reinforcing material, followed by drying.

DETAILED DESCRIPTION OF THE PREFERRED EMBODIMENTS

As described above, the characteristic ingredient in the inventive treatment agent is the specific polymethylene diamine compound represented by the general formula (I) or a hydrochloride thereof, dissolved in a solvent as the component (A). When an inorganic reinforcing material such as glass fiber materials is treated with the agent prior to compounding with a matrix resin, very firm adhesion can be obtained between the surface of the inorganic material and the matrix resin so that the composite material prepared therefrom is highly resistant against molten solder alloy and against heat shock. By virtue of the relatively long polymethylene chain of the polymethylene diamine compound with the value of n of 4 to 8, the surface of the inorganic reinforcing material and the matrix resin are bonded at the interface with flexibility so that the composite material prepared according to the invention can be imparted with greatly improved resistenace against heat shock. In addition, the interface between the inorganic material and the matrix resin is rendered less hydrophilic by the pretreatment so that the composite material prepared according to the invention is greatly improved with respect to water absorption and heat resistance against molten solder alloy. The polymethylene diamine compound is chemically stable because of the absence of any unstable functional groups in the molecular structure. The compound of course has good solubility in water and easily forms an aqueous solution which can be stored with stability for a long period of time which thus facilitates the pretreatment of the inorganic reinforcing material.

The combination of an inorganic reinforcing material and a matrix resin to which the inventive method and the treatment agent of the invention are applicable is not particularly limitative but the most satisfactory results can be obtained when the inorganic reinforcing material is a glass fiber-based or mica flake-based one and the matrix resin is an epoxy resin or a polyimide resin. The glass fiber-based reinforcing material includes glass strands as a bundle of glass filaments obtained by spinning of a known glass material such as alkali glass, non-alkali glass, low-dielectric glass, high-resilient glass, E glass for electric use and the like, non-woven glass mats, glass papers and glass cloths and tapes as a woven material of the strands. The mica flake-based reinforcing material includes flexible and rigid composite mica sheets prepared by sheeting of mica flakes with or without a heat treatment.

In general formula (I) diamine compound as the principal ingredient of the inventive $R^1$ is a methyl group or an ethyl group, $R^2$ is a divalent hydrocarbon group having 1 to 6 carbon atoms such as methylene, ehtylene, propylene and butylene and n is an integer from 4 to 8. When n is 3 or smaller, the composite material prepared by using such a treatment agent is not fully heat-resistant against molten solder alloy and is more water-absorptive (due to the increase in the hydrophilicity) along with decreased resistance against heat shock (due to the less flexible bonding at the interface between the surface of the inorganic reinforcing material and the matrix resin). When n is 9 or larger, on the other hand, solubility of the compound in water decrease somewhat along with a decrease in adhesiveness. Examples of the polymethylene diamine compound suitable as the component (A) in the inventive treatment agent include those expressed by one the following structure formulas, in which the symbols Me, Et and Ph denote a methyl group, ethyl group and phenyl group, respectively:

$(MeO)_3SiCH_2CH_2CH_2NH(CH_2)_4NHCH_2PH$;
$(EtO)_3SiCH_2CH_2CH_2NH(CH_2)_4NHCH_2PH$;
$(MeO)_3SiCH_2CH_2CH_2NH(CH_2)_6NHCH_2PH$;
$(EtO)_3SiCH_2CH_2CH_2NH(CH_2)_6NHCH_2PH$;
$(MeO)_3SiCH_2CHMeCH_2NH(CH_2)_6NHCH_2PH$;
$(MeO)_3SiCH_2CH_2CH_2CH_2NH(CH_2)_6NHCH_2PH$;
$(EtO)_3SiCH_2CH_2CH_2CH_2CH_2CH_2NH(CH_2)_6NHCH_2PH$;
$(MeO)_3SiCH_2NH(CH_2)_4NHCH_2PH$;
$(EtO)_3SiCH_2NH(CH_2)_8NHCH_2PH$; $(MeO)_3SiCH_2CH_2NH(CH_2)_8NHCH_2PH$;
$(EtO)_3SiCH_2CH_2CH_2NH(CH_2)_8NHCH_2PH$; and
$(MeO)_3SiCH_2CHMeCH_2NH(CH_2)_8NHCH_2PH$.

Hydrochlorides of these polymethylene diamine compounds can also be used as the component (A) of the treatment agent according to the invention.

Various synthetic routes can be applied to the preparation of the polymethylene diamine compounds of the general formula (I), which are novel compounds not described in any prior art literatures of which the inventors are aware. For example, the starting material is a polymethylene diamine compound represented by the general formula $$(R^1O)_3SiR^2NH(CH_2)_nNH_2,$$

in which each symbol has the same meaning as defined above. Some examples of such a diamine compound are disclosed in DEOS 2,335,751 and 2,365,977. The starting diamine compound is subjected to a dehydrochlorination reaction with benzyl chloride in a suitable organic solvent such as alcohols and aromatic hydrocarbon solvents, in the presence of a hydrogen chloride acceptor such as tertiary amines, e.g., pyridine and triethyl amine, sodium alcoholates and the like by heating the mixture at a temperature in the range from 50° to 150° C.

Alternatively, a trialkoxysilyl-substituted alkyl chloride represented by the general formula $$(R^1O)_3SiR^2Cl,$$

in which $R^1$ and $R^2$ each have the same meaning as defined above, is reacted with a N-benzyl polymethylene diamine compound of the general formula $$H_2N(CH_2)_nNHCH_2PH,$$

in which n has the same meaning as defined above, to effect the dehydrochlorination reaction, in a suitable organic solvent such as alcohols and aromatic hydrocarbon solvents, in the presence of a hydrogen chloride acceptor exemplified above by heating the reaction mixture at a temperature in the range from 50° to 150° C.

The treatment agent of the invention for use in the pretreatment of an inorganic reinforcing material is prepared by dissolving the above described polymethylene diamine compound in a suitable solvent. Most conveniently, the solvent is water in view of the water-solubility of the polymethylene diamine compound. It is preferable in order to increase the solubility of the polymethylene diamine compound in water that the water as the solvent is acidfied by adding 0.5 to 1% weight of acetic acid. Though not particularly critical, the concentration of the polymethylene diamine compound in the inventive treatment agent is preferably in the range from 0.2 to 2% by weight, more preferably from 0.5 to 1% by weight. It is of course optional that the aqeous solution is admixed with various kinds of known additives such as dyes, pigments, antistatic agents, lubricating agents and the like according to need.

The pretreatment of an inorganic reinforcing material with the aqueous solution as the inventive treatment agent is performed by dipping the reinforcing material in the solution and drying the reinforcing material thus soaked with the aqueous solution. If necessary, the amount of pick-up of the aqueous solution on the reinforcing material can be controlled by using a squeezer roller and the like. Instead of dipping in the aqueous solution, mica flake-based reinforcing materials can be soaked with the aqueous solution by spraying the solution. Heating of the reinforcing material wet with the aqueous solution at a temperature of 60° to 120° C. is effective not only to dry the wet material by evaporating the solvent but also to increase the bonding strength of the polymethylene diamine compound and the surface of the inorganic reinforcing material by the hydrolysis reaction of the alkoxy groups in the compound to form silanolic hydroxy groups and subsequent condensation reaction thereof. The amount of the polymethylene diamine compound deposited on the surface of the inorganic reinforcing material is preferably in the range from 0.01 to 10% by weight based on the dry weight of the inorganic reinforcing material.

When a composite material is prepared by compounding the glass fiber-based or mica flake-based inorganic reinforcing material pretreated in the above described manner with an epoxy resin or polyimide resin as the matrix, the composite material such as a laminate is imparted with greatly improved heat resistance under a condition of dipping in a bath of molten solder alloy and resistance against heat shock.

In the following, the present invention is described in more detail by way of examples, in which the term of "parts" always refers to "parts by weight". The composite materials prepared in the following examples were evaluated by the procedures described below for the respective items.

[Water absorption by boiling]

According to the testing procedure specified in JIS C 6481, a copper-foiled laminate was subjected to an etching treatment to remove the copper foil and then test specimens of each 50 mm by 50 mm wide were taken therefrom by cutting, which were kept in boiling water for a length of time of 4 to 16 hours to determine the amount of water absorbed thereby.

[Heat resistance against molten solder alloy]

The test specimens after the above described test for water absorptioon by boiling were put for 30 seconds on a bath of molten solder alloy at 260° C. or at 290° C. and the area of blisters was measured and recorded as the destroyed area in % relative to the overall area of the test specimen.

[Resistance against heat shock]

A copper-foiled laminate was immersed for 1 minute in liquid nitrogen and then immediately transferred into a bath of molten solder alloy at 290° C. and kept there for 30 seconds. Thereafter, the copper foil was removed by etching from the laminate and the type of damage was visually examined and recorded in four ratings of A, B, C and D according to the following criteria.

A: no damage
B: a few spot-like defects
C: many spot-like defects
D: damage all over the area with separation of layers

EXAMPLE 1.

A glass cloth after heat cleaning (WE18K107E, a product by Nitto Spinning Co.) was immersed in a treatment solution prepared by dissolving N-[3-(trimethyoxysilyl)propyl]-N'-benzyl hexamehtylene diamine hydrochloride expressed by the formula $(CH_3O)SiC_3H_6NH(CH_2)_6NHCH_2C_6H_5HCl$, (referred to as the Silane I hereinbelow), in a concentration of 5 g/liter in water containing 0.5% by weight of acetic acid and then squeezed by passing through a squeezing roller followed by drying at 110° C. for 15 minutes. The amount of the polymethylene diamine compound deposited on the glass cloth was about 0.1% by weight.

Thereafter, the thus pretreated glass cloth was impregnated, according to the formulation of NEMA Specification G-10, with a resinous varnish prepared by blending 80 parts of a bisphenol-type epoxy resin (Epikote 1001, a product by Yuka Shell Epoxy Co.), 20 parts of a novolac-type epoxy resin (Epikote 154, a product of the same company, supra), 4.0 parts of dicyandiamide, 0.2 part of benzyl dimethylamine, 20 parts of methyl ethyl ketone and 45 parts of ethylene glycol monomethyl ether and subjected to a pre-cure treatment by heating at 160° C. for 6 minutes to give a B-stage prepreg. An 8-ply stacking of the thus prepared prepreg sheets was sandwiched with copper foils and press-cured at 170° C. for 60 minutes under a pressure of 35 kg/cm$^2$ to give a double-foiled epoxy resin laminate which was subjected to the evaluation tests for the water absorption by boiling, heat resistance against molten solder alloy at 260° C. for 30 seconds and resistance against heat shock to give the results shown in Table 1.

EXAMPLES 2 and 3 and COMPARATIVE EXAMPLES 1 to 6.

The experimental procedure in each of these Examples and Comparative Examples was substantially the same as in Example 1 described above excepting replacement of the Silane I used in Example 1 with the Silanes II and III in Examples 2 and 3, respectively, and the Silane I with the Silanes IV, V, VI, VII, VIII and IX in Comparative Examples 1 to 6, respectively, the Silane II to IX each being the compound having by the following chemical name and structural formula.

Silane II: N-[3-(triethoxysilyl)propyl]-N'-benzyl hexamethylene diamine of the formula $(C_2H_5O)_3SiC_3H_6NH(CH_2)_6NHCH_2C_6H_5$ Silane III: N-[3-(trimethyoxysilyl)-2-methyl)propyl]-N'-benzyl tetramethylene diamine hydrochloride of the formula $(CH_3O)_3SiCH_2CH(CH_3)CH_2NH(CH_2)_4NHCH_2C_6H_5 \cdot HCl$ Silane IV: N-[3-(trimethoxysilyl)propyl]-N'-benzyl dimethylene diamine hydrochloride of the formula $(CH_3O)_3SiC_3H_6NH(CH_2)_2NHCH_2C_6H_5 \cdot HCl$ Silane V: N-[3-(trimethoxysilyl)propyl]-N'-benzyl decamethylenediamine hydrochloride of the formula $(CH_3O)_3SiC_3H_6NH(CH_2)_{10}NHCH_2C_6H_5 \cdot HCl$ Silane VI: 3-glycidyloxypropyl trimethoxy silane of the formula $(CH_3O)_3SiC_3H_6OGl$, in which Gl is a glycidyl group Silane VII: 3-aminopropyl triethoxy silane of the formula $(C_2H_5O)_3SiC_3H_6NH_2$ Silane VIII: 3-anilinopropyl trimethoxy silane of the formula $(CH_3O)_3SiC_3H_6NHC_6H_5$ Silane IX: N-[3-(trimethyoxysilyl)propyl]-N'-(4-vinyl)-benzyl dimethylene diamine hydrochloride of the formula $(CH_3O)_3SiC_3H_6NH(CH_2)_2NHCH_2C_6H_4CH=CH_2 \cdot HCl$ Table 1 below also shows the results of the evaluation tests of the thus prepared laminates.

EXAMPLES 4 to 6 AND COMPARATIVE

Silane XI: N-(trimethoxysilyl)methyl-N'-benzyl octamethylene diamine hydrochloride of the formula $(CH_3O)_3SiC_2H_8NH(CH_2)_8NHCH_2C_6H_5 \cdot HCl$ Silane XII: N-[3-(triethoxysilyl)-2-(methyl)propyl]-N'-benzyl hexamethylene diamine of the formula $(C_2H_5O)_3SiCH_2CH(CH_3)CH_2NH(CH_2)_6NHCH_2C_6H_5$ Each of the thus pretreated glass cloths in Examples 4 to 6 as well as the pretreated glass cloths prepared in Comparative Examples 1 to 6 for Comparative Examples 7 to 12, respectively, was impregnated with an epoxy resin blend in the same manner as in Example 1 except that the epoxy resin blend was prepared by blending, according to the formulation of NEMA Specification FR-

TABLE 1

| | | Example | | | Comparative Example | | | | | |
|---|---|---|---|---|---|---|---|---|---|---|
| | | 1 | 2 | 3 | 1 | 2 | 3 | 4 | 5 | 6 |
| Minimum concentration of acetic acid for dissolving the coupling agent, % | | 0.5 | 0.5 | 0.5 | 0.5 | 1.0 | 0 | 0 | 1.0 | 8.0 |
| Content of glass cloth in laminate, % by weight | | 59.9 | 60.2 | 60.0 | 59.5 | 59.9 | 60.3 | 59.7 | 59.6 | 59.6 |
| Water absorption by dipping in boiling water for | 4 hours | 0.63 | 0.63 | 0.62 | 0.65 | 0.63 | 0.75 | 0.70 | 0.65 | 0.62 |
| | 8 hours | 0.87 | 0.85 | 0.87 | 0.90 | 0.89 | 1.11 | 1.02 | 0.91 | 0.85 |
| | 14 hours | 1.12 | 1.11 | 1.12 | 1.18 | 1.15 | 1.48 | 1.40 | 1.17 | 1.09 |
| Destroyed area, %, by molten solder alloy on laminate boiled in water for | 4 hours | 0 | 0 | 0 | 0 | 0 | 26.2 | 22.3 | 0 | 0 |
| | 8 hours | 1.6 | 3.0 | 3.3 | 9.8 | 7.2 | 63.6 | 50.5 | 9.2 | 5.3 |
| | 14 hours | 5.7 | 12.0 | 11.9 | 20.3 | 23.6 | 80< | 80< | 27.7 | 19.6 |
| Resistance against heat shock | | B | A | B | C | D | D | D | C | C |

EXAMPLES 7 to 12.

The procedure in Examples 4 to 6 for the preparation of a pretreated glass cloths was substantially the same as in Example 1 excepting replacement of the Silane I with the Silanes X, XI and XII, respectively, indicated below.

Silane X: N-[4-(trimethoxsilyl)butyl]-N'-benzyl hexamethylene diamine hydrochloride of the formula $(CH_3O)_3SiC_4H_8NH(CH_2)_6NHCH_2C_6H_5 \cdot HCl$ 4,100 parts of a brominated epoxy resin (Epikote 5046-B-80, a product by Yuka Shell Epoxy Co.), 20 parts of a novolac-type epoxy resin (Epikote 154, a product of the same company, supra), 4 parts of dicyandiamide, 0.2 part of 2-ethyl-4-methyl imidazole, 15 parts of methyl ethyl ketone and 30 parts of dimethyl formamide to give respective prepreg sheets, from which epoxy resin laminates double-foiled with copper foils on both surfaces were prepared also in the same manner as in Example 1 and subjected to the evaluation tests to give the results shown in Table 2.

TABLE 2

| | | Example | | | Comparative Example | | | | | |
|---|---|---|---|---|---|---|---|---|---|---|
| | | 4 | 5 | 6 | 7 | 8 | 9 | 10 | 11 | 12 |
| Minimum concentration of acetic acid for dissolving the coupling agent, % | | 0.5 | 0.5 | 0.5 | 0.5 | 1.0 | 0 | 0 | 1.0 | 8.0 |
| Content of glass cloth in laminate, % by weight | | 60.2 | 60.0 | 60.5 | 59.3 | 59.5 | 60.0 | 59.8 | 59.5 | 60.1 |
| Water absorption by dipping in boiling water for | 8 hours | 0.55 | 0.56 | 0.55 | 0.60 | 0.60 | 0.99 | 0.90 | 0.63 | 0.57 |
| | 12 hours | 0.67 | 0.69 | 0.67 | 0.75 | 0.70 | 1.26 | 1.08 | 0.79 | 0.70 |

TABLE 2-continued

|  |  | Example | | | Comparative Example | | | | | |
| --- | --- | --- | --- | --- | --- | --- | --- | --- | --- | --- |
|  |  | 4 | 5 | 6 | 7 | 8 | 9 | 10 | 11 | 12 |
| Destroyed area, %, by molten solder alloy on laminate boiled in water for | 8 hours | 0 | 0 | 0 | 2.7 | 7.8 | 37.1 | 38.2 | 10.5 | 3.6 |
|  | 12 hours | 4.1 | 6.6 | 1.3 | 16.2 | 23.7 | 66.0 | 65.5 | 18.7 | 9.6 |
| Resistance against heat shock |  | B | B | A | C | D | D | D | D | D |

EXAMPLES 7 to 9 AND COMPARATIVE EXAMPLES 13 to 18.

A pretreated glass cloth was prepared in Example 7 in the same manner as in Example 1 excepting replacement of the Silane I with N-[3-(trimethoxysilyl)propyl]-N'-benzyl tetramethylene diamine hydrochloride of the formula $(CH_3O)_3SiC_3H_6NH(CH_2)_4NHCH_2C_6H_5 \cdot HCl$, referred to as the Silane XIII hereinbelow.

The thus pretreated glass cloth in Example 7, the pretreated glass cloths prepared in Examples 5 and 1 for Examples 8 and 9, respectively, and the pretreated glass cloths prepared in Comparative Examples 1 to 6 for Comparative Examples 13 to 18, respectively, were each impregnated with a mixture of 50 parts of a polyamino bismaleimide resin (Kelimide 601, a product by Rhone Poulenc Co.) and 50 parts of N-methyl-2-pyrrolidone and pre-curred by heating at 150° C. for 10 minutes to give prepregs.

An 8-ply stacking of the thus prepared prepreg sheets was sandwiched with two copper foils and press-cured at 170° C. for 60 minutes under a pressure of 35 kg/cm$_2$ followed by a post-cure treatment at 230° C. for 12 hours to give a double-foiled laminate. The thus prepared laminates were subjected to the evaluation tests in substantially the same manner as in Example 1 except that the bath of molten solder alloy was kept at 290° C. to give the results shown in Table 3.

acetic acid and the clarity of the aqueous solutions was visually examined to give the results shown in Table 4 below in three ratings of A, B and C for complete clarity, slight turbidity and apparent turbidity, respectively.

Further, the storage stability of these aqueous solutions was tested by observing appearance of turbidity when the aqueous solutions were kept standing for 1 day, 3 days or 10 days at 25° C. The aqueous solutions tested included solutions of the Silanes I, II and III in a 0.5% by weight aqueous solution of acetic acid, solution of the Silane VIII in a 1.0% by weight aqueous solution of acetic acid and solution of the Silane IX in a 8% by weight aqueous solution of acetic acid. The results are shown also in Table 4 in three ratings of A, B and C for the clarity or turbidity of the solutions as mentioned above. Gel-like precipitates were found in the solution of the Silane IX after 10 days of storage.

TABLE 4

| Silane No. | Solubility in aqueous acetic acid solution in a concentration of | | | Stability of aqueous solution by standing for | | |
| --- | --- | --- | --- | --- | --- | --- |
|  | 0.5% by weight | 1.0% by weight | 8.0% by weight | 1 Day | 3 Days | 10 Days |
| I | A | A | A | A | A | A |
| II | A | A | A | A | A | A |
| III | A | A | A | A | A | A |
| VIII | B | A | A | A | C | C |
| IX | C | C | A | B | C | See text. |

TABLE 3

|  |  | Example | | | Comparative Example | | | | | |
| --- | --- | --- | --- | --- | --- | --- | --- | --- | --- | --- |
|  |  | 7 | 8 | 9 | 13 | 14 | 15 | 16 | 17 | 18 |
| Content of glass cloth in laminate, % by weight |  | 49.9 | 49.0 | 50.3 | 50.5 | 50.2 | 50.3 | 50.0 | 49.6 | 50.5 |
| Water absorption by dipping in boiling water for | 8 hours | 0.58 | 0.60 | 0.55 | 0.63 | 0.60 | 1.00 | 0.91 | 0.65 | 0.62 |
|  | 16 hours | 1.15 | 1.22 | 1.08 | 1.29 | 1.30 | 1.57 | 1.53 | 1.29 | 1.25 |
| Destroyed area, %, by molten solder alloy on laminate boiled in water for | 8 hours | 0 | 0 | 0 | 9.8 | 16.3 | 50.6 | 38.7 | 0.8 | 10.5 |
|  | 16 hours | 8.6 | 7.7 | 13.3 | 23.9 | 25.7 | 80< | 80< | 12.8 | 26.6 |
| Resistance against heat shock |  | B | C | B | C | D | D | D | C | D |

EXAMPLE 10.

Solubility of the Silanes I, II, III, VIII and IX in water was determined by dissolving the respective Silanes in a concentration of 0.5% by weight in aqueous solutions containing 0.5%, 1.0% and 8.0% by weight of

What is claimed is:
1. In a method for the preparatin of a composite material composed of an inorganic reinforcing material and a synthethic resin as the matrix, the improvement which comprises the steps of: prior to compounding of the inorganic reinforcing material and the synthetic resin, treating the inorganic reinforcing material with a treating agent comprising: (a) a solvent; and (b) a trialkoxysilyalkyl-substituted polymethylene diamine compound represented by the general formula $(R^1O)_3SiR^2NH(CH_2)_nNHCH_2C_6H_5$ in which $R^1$ is a methyl group or an ethyl group, $R^2$ is a divalent hydrocarbon group having 1 to 6 carbon atoms and n is an integer in the range of 4 to 8, or a hydrochloride thereof, dissolved in the solvent, followed by drying, to deposit the trialkoxysilyalkyl-substituted polymethylene diamine compound or a hydrochloride thereof on the surface of the inorganic reinforcing material.

2. The method of claim 1, wherein the inorganic reinforcing material is a glass fiber-based or mica flake-based reinforcing material and the synthetic resin is an epoxy resin or a polyimide resin.

3. The method as claimed in claim 2 wherein the amount of the trialkoxysilyalkyl-substituted polymethylene diamine compound or a hydrochloride thereof deposited on the surface of the reinforcing material is in the range from 0.01 to 1.0% by weight based on the dry weight of the reinforcing material.

4. The method of claim 1, wherein the subscript n is 4, 6 or 3.

5. The method of claim 1, wherein the divalent hydrocarbon group denoted by $R^2$ is selected from the group consisting of methylene, 1,3-propylene and 2-methyl-1,3-propylene groups.

6. In a method for the preparation of a composite material composed on an inorganic reinforcing material and a synthetic resin as the matrix and adapted for use in a laminated plate for a printed circuit board, the improvement wherein the surfaces of the inorganic reinforcing material have deposited thereon as a treatment agent a trialkoxysilylakyl substituted polymethylene diamine compound represented by the general formula $(R^1O)_3SiR^2NH(CH_2)_nNHCH_2C_6H_5,$ in which $R^1$ is a methyl group or an ethyl group, $R^2$ is a divalent hydrocarbon group having 1 to 6 carbon atoms and subscript n is an integer from 4 to 8, or a hydrochloride thereof.

7. The method of claim 6, wherein the inorganic reinforcing material is glass fiber-based and the synthetic resin is an epoxy or a polyimide resin.

8. The method of claim 7, wherein the amount of the trialkoxysilyalkyl-substituted polymethylene diamine compound or a hydrochloride thereof deposited on the surface of the reinforcing material is from 0.01 to 1.0% by weight based on the dry weight of the reinforcing material.

9. The method of claim 7, wherein the subscript of the treatment is 4, 6 or 8.

10. The method of claim 7, wherein the divalent hydrocarbon group of the treatment agent denoted by $R^2$ is selected from the group consisting of methylene, 1,3-propylene and 2-methyl-1,3-propylene groups.

11. The method of claim 7, wherein the amount of the trialkoxysilyalkyl-substituted polymethylene diamine compound or a hydrochloride thereof deposited on the surface of the reinforcing material is from 0.01 to 1.0% by weight based on the dry weight of the reinforcing material; wherein the subscript n is 4, 6 or 8; and wherein the divalent hydrocarbon group denoted by $R^2$ is selected from the group consisting of methylene, 1,3-propylene and 2-methyl-1,3-propylene groups.

* * * * *